United States Patent
Zoorob et al.

(10) Patent No.: US 9,794,991 B2
(45) Date of Patent: *Oct. 17, 2017

(54) HIGH COLOUR QUALITY LUMINAIRE

(71) Applicant: PhotonStar LED Limited, Hampshire OT (GB)

(72) Inventors: Majd Zoorob, Southampton (GB); Thomas David Matthew Lee, Basingstoke (GB)

(73) Assignee: PHOTONSTAR LED LIMITED, Hants (GB)

( * ) Notice: Subject to any disclaimer, the term of this patent is extended or adjusted under 35 U.S.C. 154(b) by 0 days.

This patent is subject to a terminal disclaimer.

(21) Appl. No.: 14/336,646

(22) Filed: Jul. 21, 2014

(65) Prior Publication Data

US 2014/0327361 A1 Nov. 6, 2014

Related U.S. Application Data

(63) Continuation of application No. 13/265,893, filed as application No. PCT/GB2010/000820 on Apr. 23, 2010, now Pat. No. 8,783,901.

(30) Foreign Application Priority Data

Apr. 24, 2009 (GB) .................................. 0907101.0

(51) Int. Cl.
*H05B 33/08* (2006.01)
*H01L 33/00* (2010.01)
(Continued)

(52) U.S. Cl.
CPC ........... *H05B 33/0842* (2013.01); *F21K 9/00* (2013.01); *H01L 25/13* (2013.01); *H01L 25/50* (2013.01);
(Continued)

(58) Field of Classification Search
CPC ................ H05B 33/08; H05B 33/0803; H05B 33/0842; H05B 33/0857; H05B 33/0866;
(Continued)

(56) References Cited

U.S. PATENT DOCUMENTS

| | | | |
|---|---|---|---|
| 6,788,011 B2 | 9/2004 | Mueller et al. | |
| 7,213,940 B1 | 5/2007 | Van De Ven et al. | |

(Continued)

FOREIGN PATENT DOCUMENTS

| | | |
|---|---|---|
| EP | 1 865 564 | 12/2007 |
| JP | 2006-309209 | 11/2006 |

(Continued)

OTHER PUBLICATIONS

International Search Report and Written Opinion of corresponding International Application No. PCT/GB2010/000820, dated Aug. 30, 2010.

(Continued)

*Primary Examiner* — Thai Pham
(74) *Attorney, Agent, or Firm* — Renner, Otto, Boisselle & Sklar, LLP

(57) ABSTRACT

A color tunable lighting module is described which includes at least three solid state lighting emitters (such as light emitting diodes) and at least two wavelength converting elements (such as phosphors). The three solid state lighting emitters are formed of the same semiconductor material system and the light generated by them has dominant wavelengths in the blue-green-orange range of the optical spectrum. The two wavelengths converters are used re-emit some of the light from two of the emitters in broader spectra having longer dominant wavelengths, while the third emitter is selected to emit light at a wavelength between the dominant wavelengths of the light from the two emitters and the two converters. A control system may be employed to (Continued)

monitor and control the module and the lighting module can be optimized for tunable high color quality white light applications.

15 Claims, 15 Drawing Sheets

(51) Int. Cl.
*H01L 33/50* (2010.01)
*H01L 25/13* (2006.01)
*H01L 25/00* (2006.01)
*F21K 9/00* (2016.01)
*F21Y 115/10* (2016.01)
*F21Y 113/13* (2016.01)

(52) U.S. Cl.
CPC ............ *H01L 33/005* (2013.01); *H01L 33/50* (2013.01); *H05B 33/0803* (2013.01); *H05B 33/0857* (2013.01); *H05B 33/0866* (2013.01); *H05B 33/0869* (2013.01); *F21Y 2113/13* (2016.08); *F21Y 2115/10* (2016.08); *H01L 2224/48091* (2013.01); *H01L 2224/48247* (2013.01); *H01L 2924/0002* (2013.01); *H01L 2933/0033* (2013.01); *H01L 2933/0041* (2013.01)

(58) Field of Classification Search
CPC ..... H05B 33/0869; H01L 25/13; H01L 25/50; H01L 33/005; H01L 33/50; F21K 9/00
USPC ............ 315/151, 185 R, 291, 294, 297, 307; 362/230, 231, 251, 612, 800; 257/89, 257/E33.06, E33.056
See application file for complete search history.

(56) References Cited

U.S. PATENT DOCUMENTS

| | | |
|---|---|---|
| 2005/0127381 A1 | 6/2005 | Vitta et al. |
| 2007/0115658 A1* | 5/2007 | Mueller et al. ............... 362/231 |
| 2007/0138966 A1 | 6/2007 | Marka et al. |
| 2007/0274093 A1 | 11/2007 | Haim et al. |
| 2008/0048193 A1 | 2/2008 | Yoo et al. |
| 2008/0231214 A1 | 9/2008 | Kim et al. |
| 2008/0297054 A1 | 12/2008 | Speier |
| 2009/0184616 A1* | 7/2009 | Van De Ven et al. ............ 313/1 |
| 2011/0031894 A1* | 2/2011 | Van De Ven ................. 315/294 |
| 2012/0001555 A1* | 1/2012 | Tu et al. ........................ 315/161 |

FOREIGN PATENT DOCUMENTS

| | | |
|---|---|---|
| WO | 2008137983 | 11/2008 |
| WO | 2008140181 | 11/2008 |
| WO | 2009093895 | 7/2009 |
| WO | 2009109387 | 9/2009 |
| WO | 2009152916 | 12/2009 |

OTHER PUBLICATIONS

UK Search Report of corresponding GB Application No. 0907101.0, dated Nov. 27, 2009.

* cited by examiner

HIGH COLOUR QUALITY LUMINAIRE

FIELD OF THE INVENTION

The present invention relates to a colour tunable lighting module which includes three or more solid state lighting emitters (such as light emitting diodes) and two or more wavelength converting elements (such as phosphors). In particular the lighting module is optimised for tunable high colour quality white light applications.

BACKGROUND

Light emitting devices or diodes (LEDs) are based on a forward biased p-n semiconductor junction. LEDs have recently reached high brightness levels that have allowed them to enter into new solid state lighting applications as well as replacements for high brightness light sources such as light engines for projectors and automotive car headlights. These markets have also been enabled by the economical gains achieved through the high efficiencies of LEDs, as well as reliability, long lifetime and environmental benefits. These gains have been partly achieved by use of LEDs that are capable of being driven at high currents and hence produce high luminous outputs while still maintaining high wall plug efficiencies.

Solid state lighting applications require that LEDs exceed efficiencies currently achievable by incandescent and fluorescent lighting technologies. Currently, one of the preferred routes for the generation of White light from an LED module is by use of a single colour LED (such as a blue LED) and a wavelength converting element (such as a yellow phosphor). Wavelength converting elements (WCE) typically comprise of a yellow phosphor mixed in an encapsulant and dispensed at the correct composition on top of a blue LED chip to generate a white colour of the desired colour temperature. By modifying the fill fraction composition or % weight the white light colour may be tuned. The ability to provide white light across a large chromaticity space is advantageous for different lighting applications. However, due to manufacturing inaccuracies associated with variation in LED emission wavelength, LED emission bandwidth, variation in WCE % weight and WCE composition different LED modules will exhibit white light emission characteristics with different chromaticity values. This is undesirable as sorting and binning of LED modules post manufacture is required. Additionally, the spectrum of the total emitted light (TEL) arising from Blue and yellow emission typically provides a low to medium colour rendering index (CRI) in the range 60-80.

U.S. Pat. No. 6,788,011 describes the mixing of Red, 102, Green, 103, and Blue, 104, primary colour semiconductor LEDs to provide white colour light as shown in FIG. 1*a*. In order to achieve the desired light intensity as well as the colour chromaticity on a CIE diagram (a standard colour space created by the International Commission on Illumination), a control system is programmed with predefined LED driver power values for each individual LED colour. The light emission spectra intensity, 106, plotted against wavelength (as shown along 105) for each LED namely the Red LED, 109, Green, 108 and Blue, 107 are shown on the insert in FIG. 1*a*. The individual LEDs are assembled in a housing or board, 101. This LED lighting system suffers from several drawbacks, as detailed below.

Firstly, the LED lighting system suffers from poor Colour Rendering Index (CRI) typically around 27-30 because of the individual narrow Red, Green and Blue wavelengths (approximately 10-25 nm bandwidth wavelength emission) providing poor representation of the complete visible spectrum of light, which is typically experienced from incandescent bulb illumination or blackbody radiation, 120, as shown in the insert in FIG. 1*a*. As a reference, the CRI for a blackbody radiation is 100 and the value ranging between 0 and 100 defines how accurately light will portray colours relative to a blackbody source at the same nominal colour temperature.

Secondly, due to the different LED semiconductor material systems required to generate Red (typically InGaAlP) and Blue or Green (InGaAlN) wavelengths, the relative light intensity, voltages, lifetime and junction temperature may dramatically vary from one LED to another. It is also important to note that when the LED junction temperature is increased, the relative light output from a light emitting device comprising of a InGaAlP material system is degraded at a greater rate than a light emitting device comprising of a InGaN material system and hence all these factors will adversely affect the overall light intensity, colour chromaticity point and colour quality with lifetime and temperature giving rise to an LED lighting system that is unstable and not useable. This is typically very difficult to monitor without the addition of feedback control systems.

In U.S. Pat. No. 7,213,940B1 another colour control system is proposed, whereby a first semiconductor LED with a first lumiphor is provided to generate white light. In order to improve the CRI, a second semiconductor LED having a different emission wavelength is introduced into the optical mixing. This system provides much improved Colour Rendering Index (CRI) of around 80-92 due to the broader emission achieved by the first LED and lumiphor. The introduction of the second semiconductor LED with Red emission wavelengths has a limited emission bandwidth and hence is restricted in the amount that the CRI can be increased. Secondly, the external efficiency of state of the art commercial red emitting semiconductor materials such as InGaAlP is typically 30%, which is much lower than that of GaN based blue emitting semiconductor LED systems (state of the art commercial LED external efficiency at 45%). Additionally, similar lifetime degradation problems compared to LED lighting devices in U.S. Pat. No. 6,788,011 are also experienced with the second semiconductor degrading at a different rate to the first LED.

In published U.S. Patent Application No. 2008/0048193 A1 a white LED module including a further circuit board is described. The LED module cross sectional schematic is shown in FIG. 1*c*. In one example of the invention a Green semiconductor LED, 103 and a Blue semiconductor LED, 104 are placed on circuit board 101. A Red phosphor, 112, is disposed over 103 and 104 to provide a total emitted white light intensity, 106, against wavelength 105. The total emitted white light has a broad red phosphor emission, 109, and narrow blue, 107, as well as a narrow green emission, 108, from the semiconductor LED die. The white light generated from the LED module suffers from a poor CRI (expected to be approximately 50-60) due to the narrow light emissions in the Blue and Green wavelength regions. Additionally, the intensity of the Green light, 113, is dramatically attenuated, 108. The total green light initially emitted from the LED die 103 is shown as a dotted line, while following the propagation through the Red phosphor 112 the final transmitted green light is shown as the solid line 108. The attenuated green light dramatically affects the total efficiency of the LED module. It is important to note that this applies across all wavelengths and not specifically for Red phosphors only.

As will be appreciated by those skilled in the art, there is currently a need for a LED module that combines the known benefits of low cost LED modules with the functionality of tunable colour chromaticity. It would be desirable to provide a module having uniform chromaticity properties, and which also displays good CRI and stable light intensity with a long lifetime.

SUMMARY OF THE INVENTION

According to a first aspect of the present invention, a light emitting module comprises a first light emitting device (LED) package, a second LED package and a third LED package, the total light emitted by the module comprising light emitted by the first, second and third light emitting packages, wherein:

the first LED package comprises a first semiconductor LED and a first wavelength converting element, wherein when activated the first semiconductor generates light comprising a first dominant wavelength $\lambda_1$;

the second LED package comprises a second semiconductor LED and a second wavelength converting element, wherein when activated the second semiconductor generates light comprising a second dominant wavelength $\lambda_2$; and, the third LED package comprises a third semiconductor LED which, when activated, generates light comprising a third dominant wavelength $\lambda_3$, wherein:

the first, the second and the third semiconductor LED comprise the same semiconductor material system;

at least a portion of the light generated by the first semiconductor LED is incident on the first wavelength converting element and is re-emitted with a first converted optical spectrum comprising a first dominant converted wavelength $\lambda_{C1}$ such that $\lambda_1 < \lambda_{C1}$;

at least a portion of the light generated by the second semiconductor LED is incident on the second wavelength converting element and is re-emitted with a second converted optical spectrum comprising a second dominant converted wavelength $\lambda_{C2}$ such that $\lambda_2 < \lambda_{C2}$, wherein the second converted optical spectrum is different than the first converted optical spectrum and $\lambda_{c1} \le \lambda_{C2}$;

the colour chromaticity of light emitted by the first light emitting package resides in a 1960 CIE Uniform Colour Space bounded by a lower isotherm at a correlated colour temperature of $T_1$ K and an upper isotherm at a correlated colour temperature of 200,000 K, wherein an isotherm is defined as the line perpendicular to the Planckian locus, said light having a maximum colour chromaticity shift of $\Delta_{uv} \le \pm 0.10$ from the Planckian locus;

the colour chromaticity of light emitted by the second light emitting package resides in a 1960 CIE Uniform Colour Space bounded by an upper isotherm at a correlated colour temperature of $T_2$ K and a lower isotherm bounded at the correlated colour temperature of 1,000 K, said light having a maximum colour chromaticity shift $\Delta_{uv} \le \pm 0.10$ from the Planckian locus, wherein the correlated colour temperature point of the intersection of the isotherm $T_1$ K with the Planckian is greater than or equal to $T_2$ K; and, the third dominant wavelength $\lambda_3$ of light emitted by the third light emitting package satisfies the criteria $\lambda_1$, $\lambda_2 < \lambda_3 < \lambda_{C1}$, $\lambda_{C2}$ and 485 nm $\le \lambda_3 \le$ 595 nm.

In this way, the present invention provides a low cost LED module with well defined chromaticity properties and the functionality of tunable colour chromaticity for use in high colour quality white light applications.

Preferably, the correlated colour temperatures are defined such that $T_1$ K=5,700 K and $T_2$ K=3250 K.

Preferably, the total light emitted by the module is pre-defined at a correlated colour temperature of 4000 K and within a-4 step MacAdam ellipse and also a colour rendering index (CRI) of the light is greater than or equal to 92.

In some embodiments of a light emitting module of the present invention it is preferred that:

the light emitted by the first light emitting package resides at a first pre-selected correlated colour temperature within a MacAdam having a colour chromaticity tolerance greater than within a four step ellipse;

the light emitted by the second light emitting package resides at a second pre-selected correlated colour temperature within a MacAdam having a colour chromaticity tolerance greater than within a four step ellipse;

the total light emitted by the module resides within a triangle bounded by the colour chromaticity of the first, second and third light emitting packages and having a pre-defined correlated colour temperature within a four step MacAdam ellipse tolerance; and, the light emitting module has an efficiency parameter and a colour rendering index (CRI) parameter that is greater than or equal to the lower of said parameters for the first and second light emitting packages.

The light emitting module my further include a fourth LED package comprising a fourth semiconductor LED which, when activated, generates light comprising a fourth dominant wavelength $\lambda_4$, in the wavelength range 405 nm $\le \lambda_4 \le$ 475 nm. This provides for even greater flexibility in tuning and controlling the overall chromaticity of the light produced.

In some embodiments of a light emitting module of the present invention it is preferred that:

the total light emitted by the module is tunable within a correlated colour temperature range of 3,000 K to 6,500 K and is defined within a 4 step MacAdam ellipse; and, a colour rendering index (CRI) for the light emitting module within the correlated colour temperature range of 3,500 K to 6,000 K is greater than or equal to 90.

According to a second aspect of the present invention, a light emitting unit comprises:

a light emitting module according to the first aspect; and, a memory module affixed proximal to the light emitting module, wherein pre-determined calibration parameters for the light emitting module are registered on the memory module.

In this way, pre-determined calibration parameters are readily accessible for use the operation of and control of the light emitting module.

Preferably, the memory module calibration parameters comprise one or more selected from a group which includes: first CIE xy coordinates, second CIE xy coordinates, third CIE xy coordinates, fourth CIE xy coordinates, relative light intensity against electrical current, and relative light intensity against ambient temperature.

According to a third aspect of the present invention, a controlled light emitting system comprises:

a light emitting module according to the first aspect or a light emitting unit according to the second aspect; and, a control system for managing activation properties of at least one of the first, second, third and fourth light emitting packages in the light emitting module when activated, the control system being adapted to manage the activation properties to achieve a predefined colour chromaticity and CRI for the total light emitted by the light emitting module.

The provision of a control system allows for tunable control of the module and the activation of the individual packages and the light therefrom.

Preferably, the control system is further adapted to monitor electrical and thermal properties of the light emitting packages in the module and to provide feedback for modifying activation properties of the light emitting packages in order to achieve the predefined colour chromaticity and CRI for the total light emitted by the light emitting module.

The controlled light emitting system may further comprise a light sensor oriented to measure the colour chromaticity properties of at least part of the total light emitted by the light emitting module, the control system being coupled to the light sensor and adapted to provide feedback to modify activation properties of the light emitting packages to achieve the predefined colour chromaticity and CRI for the total light emitted by the light emitting module.

The control system may also include an interface for connection to external sources and for receiving information from the external sources.

As will be appreciated, the control system of the present invention can provide for dynamic feedback and control of the light emitting module through either integral sensor or information received from external sources.

According to a third aspect of the present invention, there is provided a method of manufacturing the light emitting unit of the second aspect or the controlled light emitting system of the third aspect, the method comprising the steps of:
  providing the first, second and third light emitting packages and attaching them to a sub-mount;
  affixing a colour mixing element proximal to the sub-mount such that it is at least partially in a propagation path of the total light emitted by the light emitting module;
  affixing a memory module proximal to the light emitting module;
  activating the light emitting module and determining calibration parameters for the module; and,
  registering the calibration parameters on the memory module.

When manufacturing the controlled light emitting system of the third aspect, it is preferred that the method further comprises the steps of:
  assembling the control system;
  presetting parameters in the control system; and,
  interfacing the control system to the light emitting module and memory module,
  whereby the control system is adapted to interrogate the memory module and to employ parameters residing on the memory for managing the activation properties of at least one of the first, second, third light emitting package in the light emitting module to achieve a predefined colour chromaticity and CRI for the total light emitted by the light emitting module.

The present invention provide the benefits of a low cost light emitting module with uniform chromaticity properties in the far field and having long and controlled lifetime yet also offering the flexibility and intelligence of tunable colour chromaticity, CRI and intensity either at manufacture or in the end user lighting application.

BRIEF DESCRIPTION OF THE DRAWINGS

Examples of the present invention will now be described in detail with reference to the accompanying drawings, in which.

DETAILED DESCRIPTION

Figure 1A:
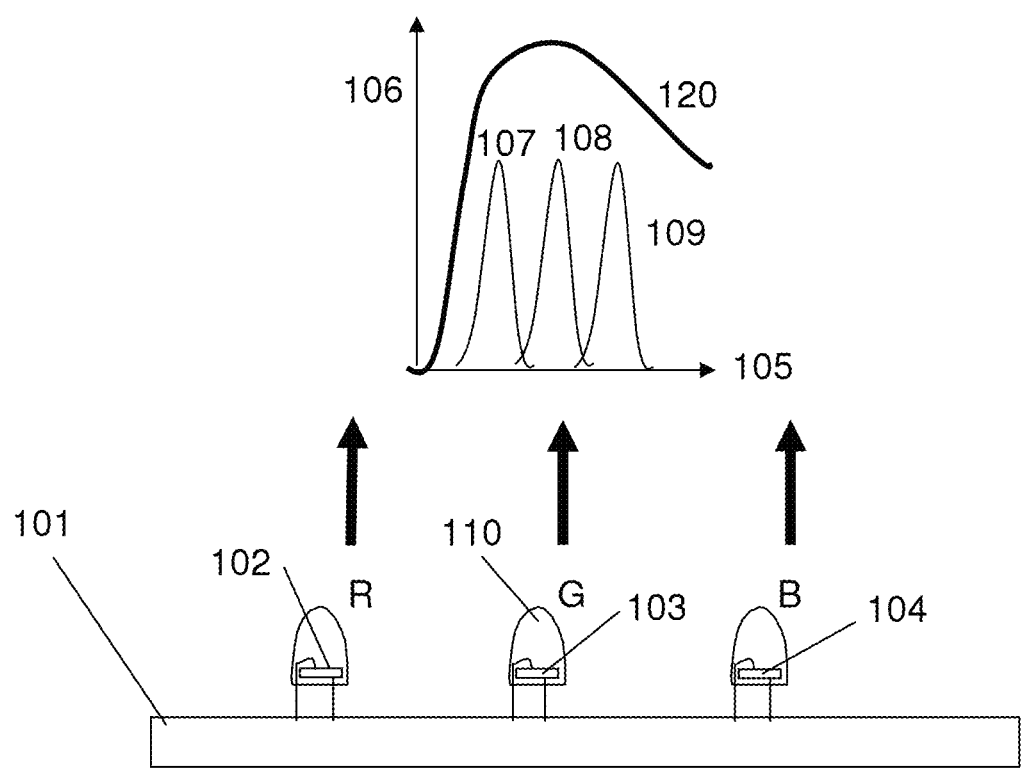
FIG. 1a (prior art) shows a first example LED module of the prior art.
Figure 1B:
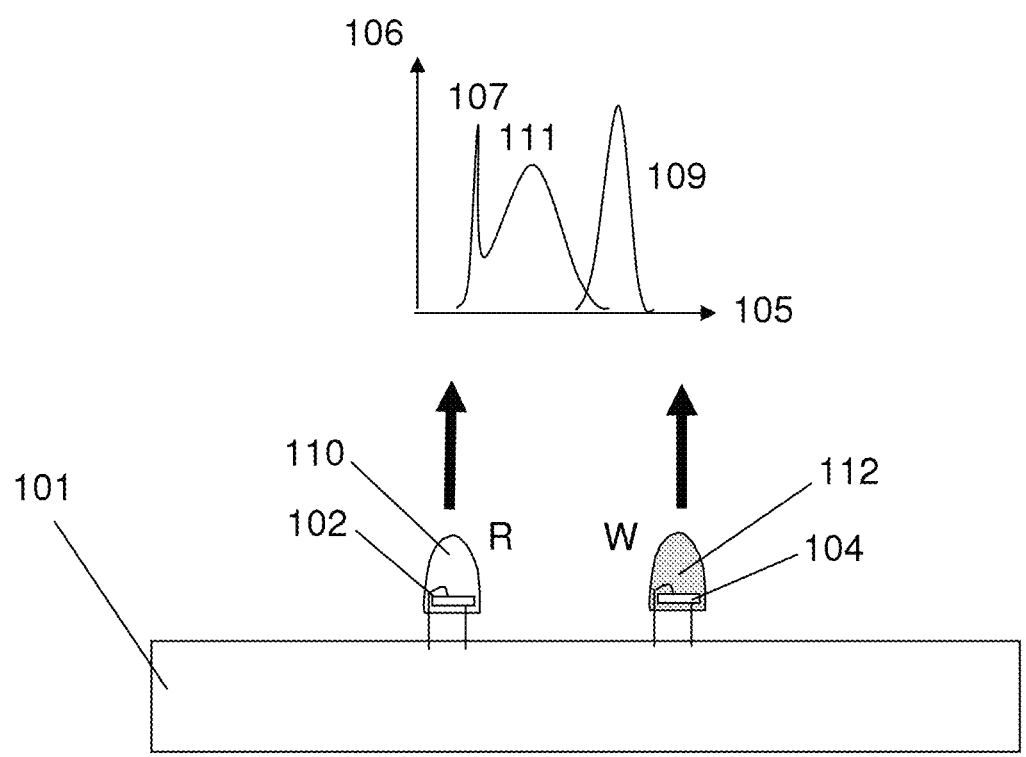
FIG. 1b (prior art) shows a second example LED module of the prior art.
Figure 1C:
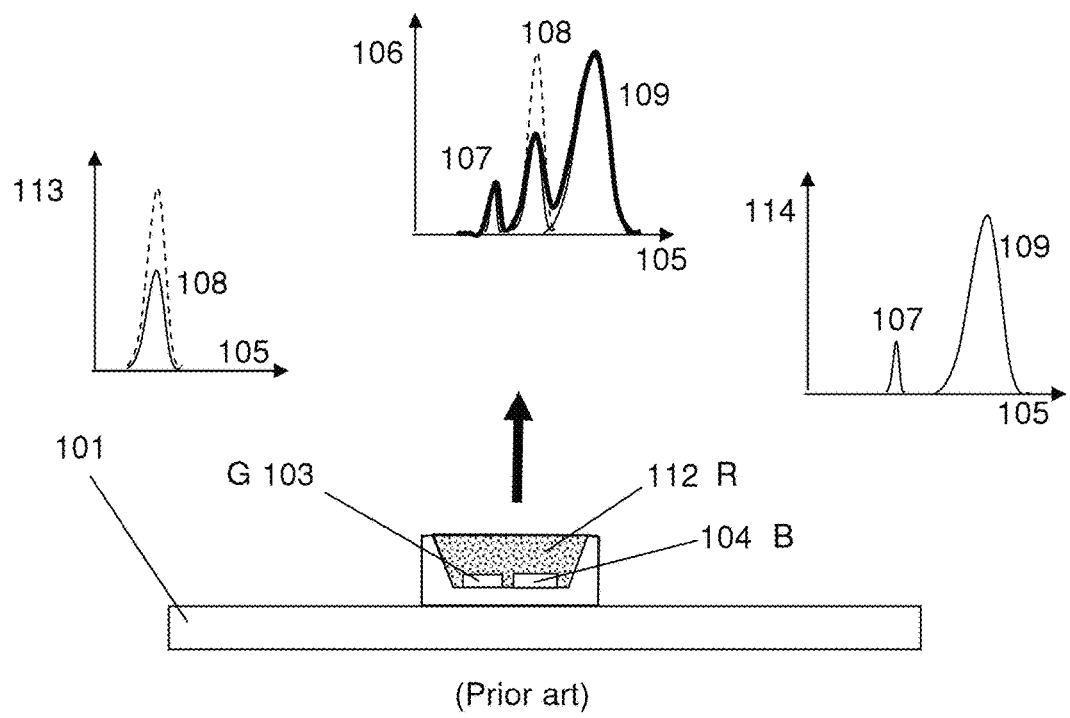
FIG. 1c (prior art) shows a third example LED module of the prior art.

The object of the present invention is to provide a high wall plug efficiency low cost light emitting module and control system having a light output that is flexible and intelligent capable of tuning colour chromaticity, colour rendering index (CRI) and light intensity. In a first aspect, the high colour quality light source comprises a light emitting module employing the colour mixing of three or more light emitting devices having different light emission properties but comprising the same fundamental semiconductor material system. The accurate definition and mixing of the individual light emitting packages within the light emitting module enables a rich spectral light emission offering high colour quality and CRI. The pre-determined variation in the activation properties of individual light emitting packages within the light emitting module enables control and tunability in the light emission.

In a second aspect, the high colour quality light source further comprises a memory module for storing pre-determined calibration parameters. In yet a third aspect, the tunable light emitting module may additionally incorporate a control system and may be pre-set during manufacture or actively defined or monitored in the end user lighting application.

The present invention can be incorporated using a light emitting device (LED) of any semiconductor material system such as, but not restricted to, InGaN, InGaP, InGaAs, InP, or ZnO. However, for illustrative purposes, and as a preferred example, Blue wavelength InGaN semiconductor LED having a vertical contact pad structure (sometimes termed vertical LED structure, or thin GaN) will be described in the bulk of the detailed description of the invention.

The light emitting module of the present invention may include a light emitting package comprising a semiconductor LED, a wavelength converting element (WCE) and a sub-mount. The sub-mount is provided to allow for physical support of the LED and the WCE as well as a method for improved thermal dissipation to the surroundings of heat generated in the LED and WCE. The package may further include an optical component, such as a lens, designed to collect the light emission from the LED and WCE and shape the emission profile.

The wavelength converting element (WCE) may comprise a phosphor, Quantum Dots (QDs), nano-phosphors, organic light emitting material or other electrically, ionically or optically pumped light emitting material. The wavelength converting elements may further include surface treatments and WCE shell coatings to provide improved light coupling and extraction as well as prolong lifetime and thermal stability. The WCE may further comprise optical scatterers or diffusers as well as refractive index modifying fillers.

Activation of a light emitting device may comprise electrically connecting the light emitting devices using voltage or current driven power supplies. The device may be activated using pulsed, switched, sinusoidal, modulated or constant signals. The light emitting devices are preferably activated using constant current or voltage.

Figure 1D:
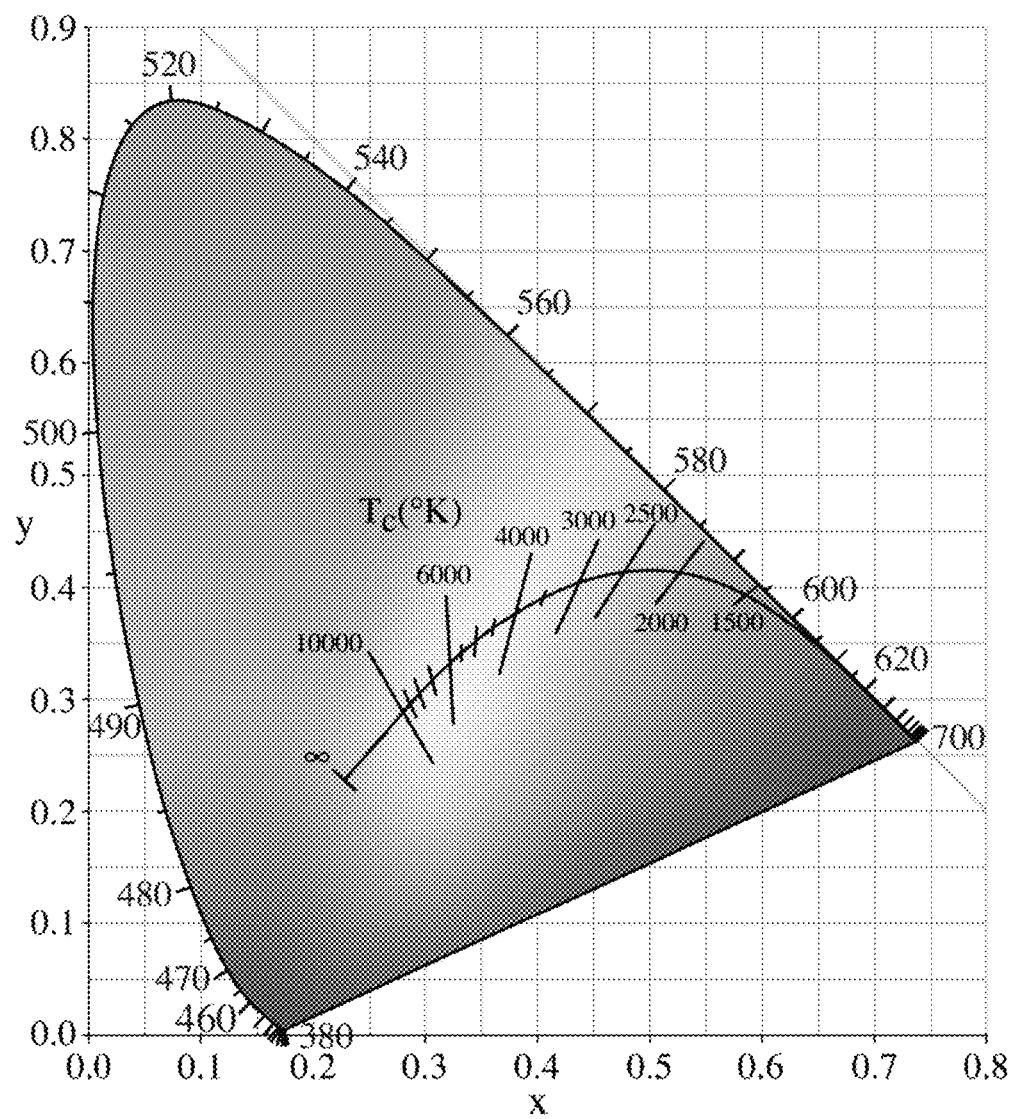
FIG. 1d (prior art) shows a 1931 CIE Chromaticity Diagram.

For the purpose of describing the present invention, the colour chromaticity will be defined with reference to a 1931 CIE Chromaticity Diagram using a CIE xyY colour space and also to a 1960 CIE Uniform Colour Space (UCS) diagram. A standard 1931 CIE Chromaticity colour space diagram is shown in FIG. 1d. For simplicity, the luminance parameter will be removed from the notation and only the chromaticity parameters will be specified by the parameters x,y on the colour space.

Figure 2A:
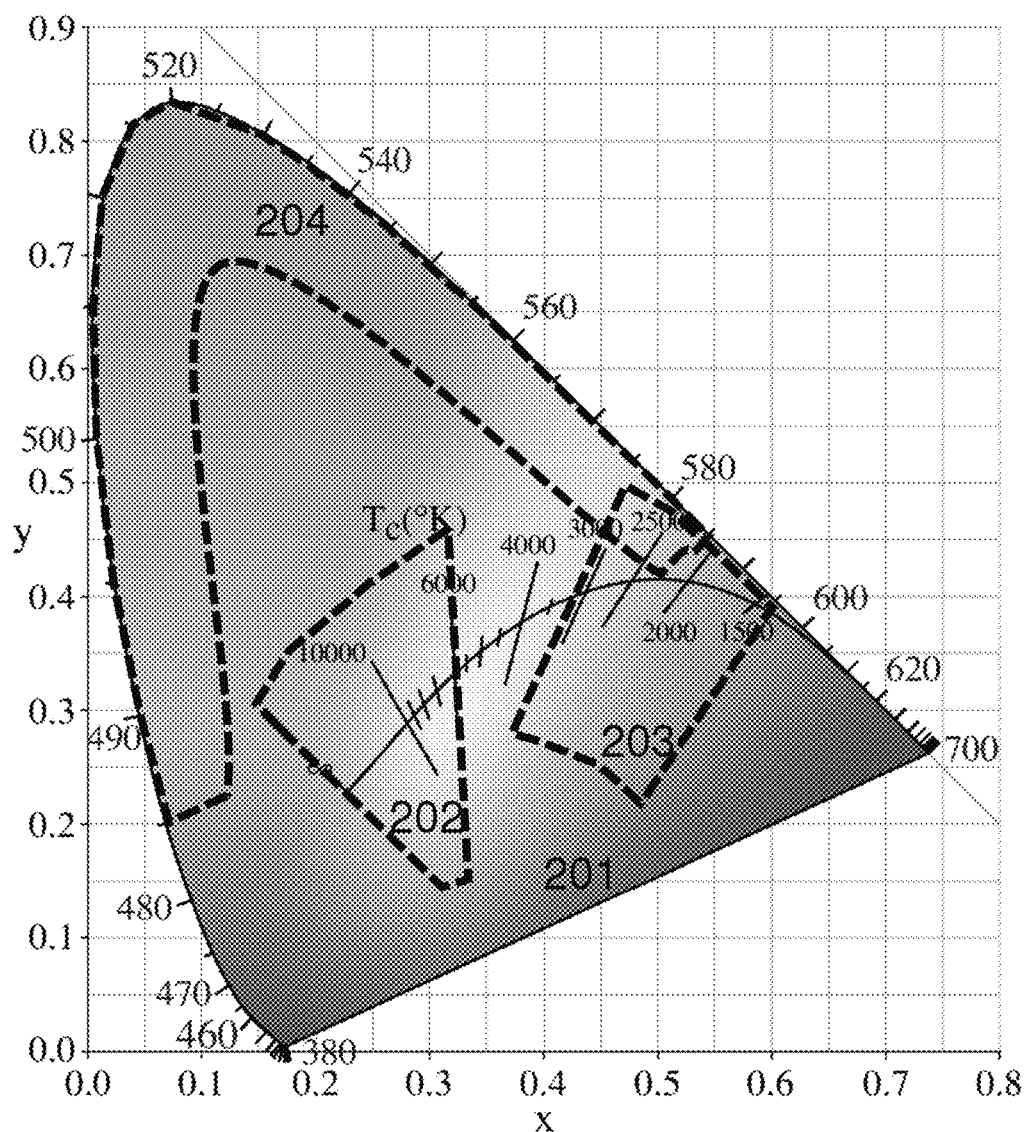
FIG. 2a shows the allowable chromaticity space for the first, second and third light emitting package of the present invention superimposed on a 1931 CIE Chromaticity diagram.
Figure 2B:
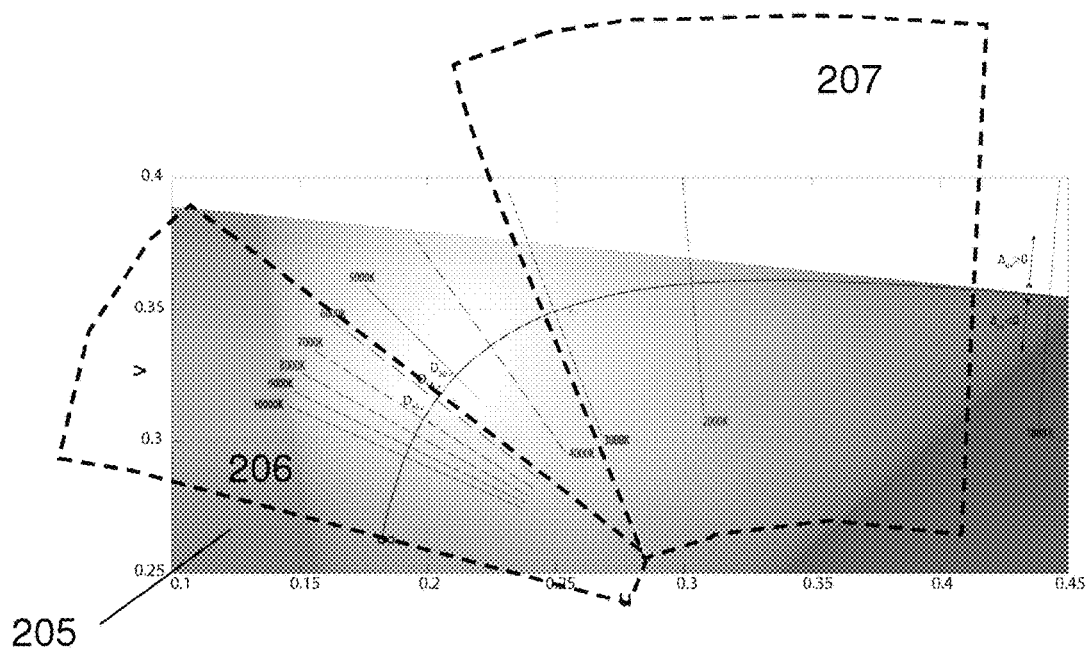
FIG. 2b shows a 1960 CIE UCS diagram having the allowable chromaticity space for the first and second light emitting package.

In a first embodiment of the invention, a light emitting module comprising a combination of first, second and third light emitting packages is proposed. The first, second and third light emitting package are selected such that upon activation the light emission is substantially different. The light emission from the first, second and third light emitting package is colour mixed to achieve the total emitted light (TEL). In a preferred embodiment the first light emitting package comprises a first semiconductor light emitting device and a first WCE. The second light package device comprises a second semiconductor light emitting device and a second WCE. The third light emitting package comprises of a third semiconductor light emitting device. FIG. 2a illustrates the colour chromaticity of the light emission from the three packages on a standard CIE diagram of the type shown in FIG. 1d, whilst FIG. 2b illustrates the allowed colour chromaticity of the light emission from the first and second packages on a 1960 CIE Uniform Colour Space (UCS) diagram.

In the case of the first light emitting package, the colour chromaticity of the light emission resides in a region bounded by the lower isotherm, namely a perpendicular line to the Planckian locus at an arbitrary correlated colour temperature (CCT) defined as $T_1$ K and the upper isotherm bounded at the correlated colour temperature 200,000K, as shown by the dashed boundary 202 in FIG. 2a. In FIG. 2b the bounded region 206, for the first light emitting package is depicted on a 1960 CIE Uniform Colour Space (UCS) diagram 205. In the colour space 205 shown, the allowable light emission region for the first light emitting device is again bounded by the isotherms $T_1$ K CCT and 200,000K CCT, while the extent of the colour chromaticity shift away from the Planckian is up to $\Delta_{uv}=\pm 0.10$.

In a preferred example of the present invention the colour chromaticity of the first light emitting package resides in a region bounded by the lower isotherm, namely a perpendicular line to the Planckian locus at the correlated colour temperature (CCT) 5,700K and the upper isotherm bounded at the correlated colour temperature 200,000K. As shown by the dashed boundary 202 in FIG. 2a. In FIG. 2b the bounded region 206, for the first light emitting package is depicted on a 1960 CIE Uniform Colour Space (UCS) diagram 205. In the colour space 205 shown, the allowable light emission region for the first light emitting device is again bounded by the isotherms 5,700K CCT and 200,000K CCT while the width of the isotherms are defined as $\Delta_{uv}=\pm 0.10$.

In the case of the second light emitting package the colour chromaticity of the light emission resides in a region bounded by the upper isotherm, namely a perpendicular line to the Planckian locus at an arbitrary correlated colour temperature (CCT) defined as $T_2$ K and the lower isotherm bounded at the correlated colour temperature 1,000K, as shown by the dashed boundary 203 in FIG. 2a. In FIG. 2b, the bounded region 207 for the second light emitting device is depicted on a 1960 CIE Uniform Colour Space (UCS) diagram 205. In the colour space 205 shown, the allowable light emission region for the first light emitting device is again bounded by the isotherms $T_2$ CCT and 1,000K CCT while the width of the isotherms are defined as $\Delta_{uv}=\pm 0.10$.

In the present invention, the point of intersection of the upper isotherm boundary at $T_1$ and the Planckian locus is at a CCT value greater than or equal to the point of intersection of the lower isotherm boundary $T_2$ and the Planckian locus as defined by the following inequality:

$$T_1 \geq T_2$$

In a preferred example of the present invention, the colour chromaticity of the second light emitting package resides in a region bounded by the upper isotherm, namely a perpendicular line to the Planckian locus at the correlated colour temperature (CCT) 3,250K and the lower isotherm bounded at the correlated colour temperature 1,000K, as shown by the dashed boundary 203 in FIG. 2a. In FIG. 2b, the bounded region 207 for the second light emitting device is depicted on a 1960 CIE Uniform Colour Space (UCS) diagram 205. In the colour space 205 shown, the allowable light emission region for the first light emitting device is again bounded by the isotherms 3,250K CCT and 1,000K CCT while the width of the isotherms are defined as $\Delta_{uv}=\pm 0.10$.

The third light emitting package comprises a third semiconductor light emitting device upon activation having a light emission with a colour substantially in the Green to Yellow range. The dominant wavelength of the light emission of the third light emitting device is bounded between 485 nm and 595 nm. It is an object of the present invention that the third semiconductor light emitting device comprises a semiconductor material system that is identical to the first and second semiconductor light emitting device. This provides improved intensity and colour stability with life and changes in LED junction temperature.

Figure 3A:
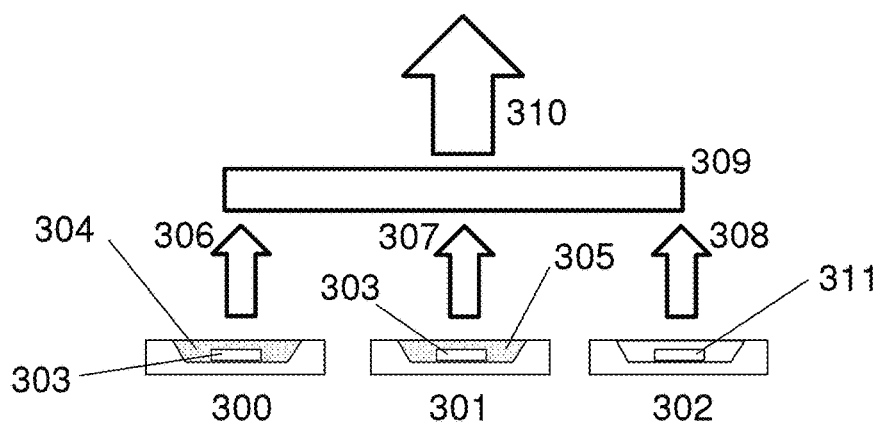
FIG. 3a shows a schematic of an example light emitting module of the present invention.

A schematic depicting an example light emitting module of the present invention is shown in FIG. 3a. The light emitting package of the first, second and third type are depicted as 300, 301 and 302, respectively. In the case of packages 300 and 301, there is also included a first and second WCE element, namely 304 and 305, respectively. In the case of 304, the light emission is predominantly yellowish-green and when colour mixed with the blue emission of the first semiconductor light emitting device, 303, the resulting emission, 306, resides within a chromaticity region bounded by 202 in FIG. 2a. In the case of the second light emitting package, 301, with the associated WCE 305, the light emission is predominantly yellowish-orange and when colour mixed with the blue emission of the first semiconductor light emitting device, 303, the resulting emission, 307, resides within a chromaticity region bounded by 203 in FIG. 2a. In the third light emitting package, 302, the light emission is predominantly arising from the third semiconductor light emitting device, 311, with the resulting emission, 308, having a cyan to green wavelength range that resides within a chromaticity region bounded by 204 in FIG. 2a.

The light emission from the first, second and third light emitting packages are allowed to colour mix, 309, to achieve the total emitted light (TEL), 310. The colour mixing may comprise, but is not limited to, direct colour mixing using one or more of the following techniques, a refractive light guides and lenses, reflective light guides and reflectors, specular light guides and reflectors, diffuse light guides and reflectors, optical scattering, coherent back scattering, optical diffuser sheets, diffractive optical elements (DOE), optical lenses, Fresnel lenses, microlens arrays, back scattering using diffuse reflective sheets, diffraction gratings, sub-wavelength optics, integrating sphere, diffuse optical cavities, specular optical cavities, multilayers stacks, optical filters, high reflectivity materials, textured reflectors, multi-faceted reflectors and sub-wavelength optics, such as nano-textured surfaces and bulk materials, as well as photonic crystal optical elements.

It is important to note that the exact location, device design, manufacturing process and composition of the first, second and third light emitting package and resulting light emitting module of the present invention may vary from the schematic shown and should not detract from the main aspects of the invention. The light emitting packages may further include additional materials and components such as a sub-mount and optical lens. The sub-mount is designed to aid in physical attach of the light emitting device and enable improved thermal dissipation between the LED junction and the surrounding. The optical lens may be designed to help light extraction and collect the light emission from the LED and WCE and re-shape the emission.

Figure 3B:
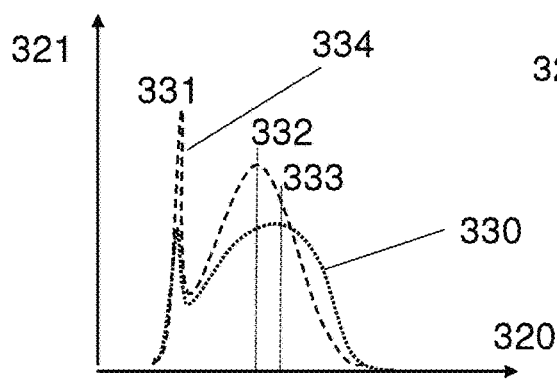
FIG. 3b shows a graph of power spectral density against wavelength of the first and second light emitting package.

The light emission spectrum of the first light emitting package, 334, and the second light emitting package, 330, is shown in FIG. 3b. The plot highlights the emission power density, 321, against optical wavelength 320. It is seen that both the first and second semiconductor light emitting device emit at a peak in the blue region of the wavelength range, 331, between 400 nm and 460 nm. The WCE emission component of the light emitting packages constitutes the broader emission having a dominant wavelength in the yellow region, 332, for the first light emitting package, and orange region, 333, for the second light emitting package.

It is an object of the present invention that the first and second light emitting packages do not require accurate pre-selection of the chromaticity point to within a 4-step MacAdam ellipse in order to achieve accurate white CCT along the Planckian. It is an object of the present invention that the first and second light emitting packages reside within a much larger chromaticity domain, as depicted by 202 and 203. In a preferred implementation of the present invention, the acceptable tolerance on the first and second light emitting package is greatly increased and may be greater than a 4-step MacAdam ellipse, but preferably within a 7-step MacAdam ellipse of the selected CCT. This enables much improved colour binning manufacture yield on first and second light emitting packages that may be selected for integration into the light emitting module.

Figure 3C:
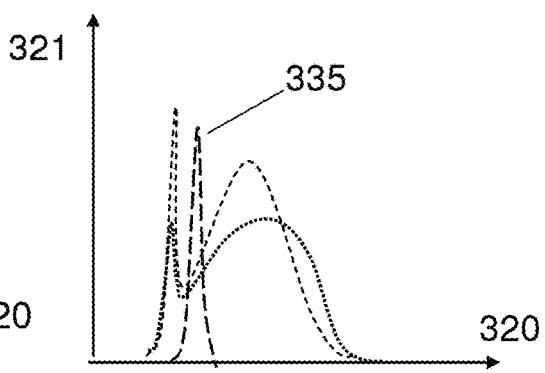
FIG. 3c shows a graph of power spectral density against wavelength of the first, second and third light emitting package.

In the present invention the variability in colour chromaticity and CRI is eliminated from the package level manufacturing tolerances and elevated to a light emitting module level concept, whereby defining the correct light intensity for each individual first, second and third light emitting package provides the desired CCT within the desired MacAdam ellipse defining the tolerance of perceived colour. In a preferred embodiment of the invention, the desired CCT value is within a 4-step MacAdam ellipse of the target value. The addition of the third light emitting package with a light emission spectrum, 335, as depicted in FIG. 3c, both enables the ability to shift the CCT as well as improve colour quality.

Figure 3D:
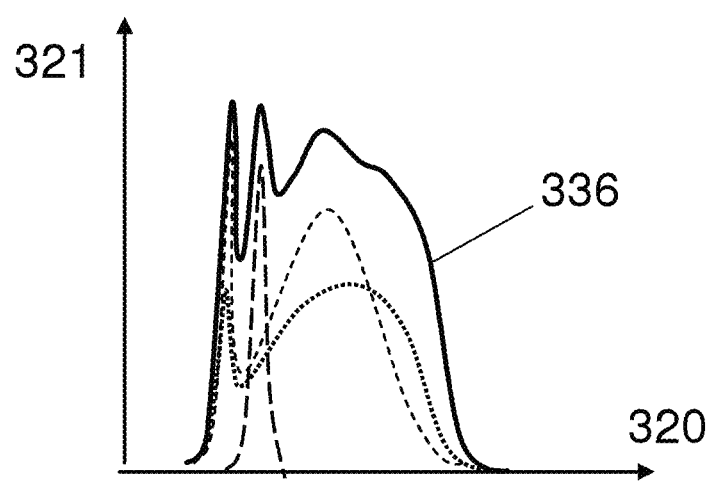
FIG. 3d shows a graph of power spectral density against wavelength of the light emitting module of the present invention.

The TEL of the resulting light emitting module is bounded by a triangle having vertices at the CIExy coordinates of the first, second and third light emitting module, thereby enabling increased flexibility and tunability in the desired colour chromaticity of the module. Additionally, improved colour quality is achieved by adding the spectral content of the third light emitting package 335, and overlapping with the region having minima in the spectrum of the first and second light emitting devices, 334 and 330. This provides a TEL spectrum, 336, as shown in FIG. 3d, with increased colour uniformity and colour quality when compared with the individual first, second and third light emitting devices.

In a preferred embodiment of the present invention, the light emission from the third light emitting package is a shorter wavelength green (or cyan) within the range 485 nm to 520 nm in order to overlap the minima dip residing in the spectrum between the blue wavelength light emission from the semiconductor device and the yellow emission from the phosphor (WCE) of the first and second light emitting package.

By adjusting the intensity of the first, second and third light emitting devices, the CCT of the light emitting module of the present invention can be shifted along the Planckian locus and bounded only by the isotherm perpendicular to the CCT of the first light emitting device and the isotherm perpendicular to the CCT of the second light emitting device, and residing within a narrow well defined 4-step MacAdam ellipse along the Planckian. In the present example, there exists at least three light emitting devices having only three possible different light emission spectra, namely those of the first, second and third light emitting device type, and a CIE chromaticity point along the Planckian may be achieved by defining one unique combination of intensities for each individual first, second and third light emitting device. This provides a fixed efficiency and CRI for the light emitting module of the present invention determined only by the underlying efficiency and emission spectrum of the first, second and third light emitting device as well as the pre-selected CCT of TEL.

The optical characteristics of the first, second and third light emitting package for an example light emitting module of the present invention are highlighted in Table 1. The correlated colour temperature (CCT) for the third type light emitting package is not defined and hence the associated CRI is also not defined. The efficiency is measured at a pulsed current of 350 mA for all light emitting packages.

TABLE 1

| Light emitting package | Description | CCT (K) | CRI | CIExy x | y | Efficiency (lm/W) |
|---|---|---|---|---|---|---|
| First type | Cool White LED | 6500K | 72 | 0.314 | 0.324 | 92.6 |
| Second type | Warm White LED | 2700K | 82 | 0.460 | 0.411 | 76.2 |
| Third type | Green LED | — | — | | | 69.3 |

By employing a pre-defined variation in intensity for each first, second and third light emitting package, the light emitting module of the present invention can achieve a tunable CCT between 3000K and 6000K and within a 4 step MacAdam ellipse of the Planckian locus while additionally achieving improvements in the CRI of TEL of the light emitting module.

TABLE 2

| Tunable CCT (K) | Relative intensity of Light emitting packages (%) | | | CIExy | | CRI | Relative CRI improvement (%) |
|---|---|---|---|---|---|---|---|
| | First type | Second type | Third type | x | y | | |
| 3000 | 8.3 | 89.9 | 1.8 | 0.437 | 0.404 | 84 | 16.7 |
| 3500 | 26.7 | 70.0 | 3.3 | 0.406 | 0.391 | 84 | 16.7 |
| 4000 | 44.1 | 52.9 | 3.1 | 0.381 | 0.377 | 82 | 13.9 |
| 4500 | 60.0 | 38.0 | 2.0 | 0.361 | 0.364 | 80 | 11.1 |
| 5000 | 74.5 | 25.1 | 0.4 | 0.345 | 0.352 | 77 | 7.0 |

Table 2 illustrates the optical Characteristics for the light emitting module of the present invention, and in particular the relative intensity levels relative to the light intensity at a constant current of 350 mA required from each channel are highlighted. The relative increase or improvement in CRI of the light emitting module over the first light package type is also highlighted.

In another aspect of the present invention, the TEL resides on the Planckian locus and the efficiency of light emitting module is at least higher than the lowest of the first and second light emitting packages and not sensitive to the least efficient light emitting package namely the semiconductor third module having no WCE. This is contrary to conventional colour changing modules which rely on individual Red, Green and Blue LED and are limited by the least efficient of the underlying single wavelength semiconductors. This is typically limited by the efficiency of Blue LEDs around 22 lm/W for best in class and Red LED modules, around 70 lm/W for best in class. As an example, if an RGB source delivering a White light with a CCT of approximately 5500K the efficiency would not exceed 57.3 lm/W with a poor CRI of around 30-50.

The efficiency for a light emitting module of the present invention at different CCT points is highlighted in Table 3. Both the efficiency and the CRI are dramatically improved when compared with RGB light modules. Table 3 also indicates the increase in efficiency across the complete CCT tuning range when compared to the efficiency of the light emitting package of the second type. The efficiency of the first light emitting package is 92.6 lm/W, second light emitting package is 76 lm/W and 69 lm/W for the third light emitting device. The relative improvement in CRI is compared to light emitting package of the first type.

TABLE 3

| CCT (K) | CIExy x | y | Efficiency (lm/W) |
|---|---|---|---|
| 3000 | 0.437 | 0.404 | 77.0 |
| 3500 | 0.406 | 0.391 | 80.0 |
| 4000 | 0.381 | 0.377 | 83.0 |
| 4500 | 0.361 | 0.364 | 85.7 |
| 5000 | 0.345 | 0.352 | 88.3 |

In yet another implementation of the present invention the light emitting module may comprise TEL spectral characteristics that are designed to provide CIExy coordinates off the Planckian locus. The design criteria enables the TEL of the light emitting module of the present invention to possess a chromaticity point residing within the triangle bounded by the first, second and third light emitting packages.

Figure 4A:
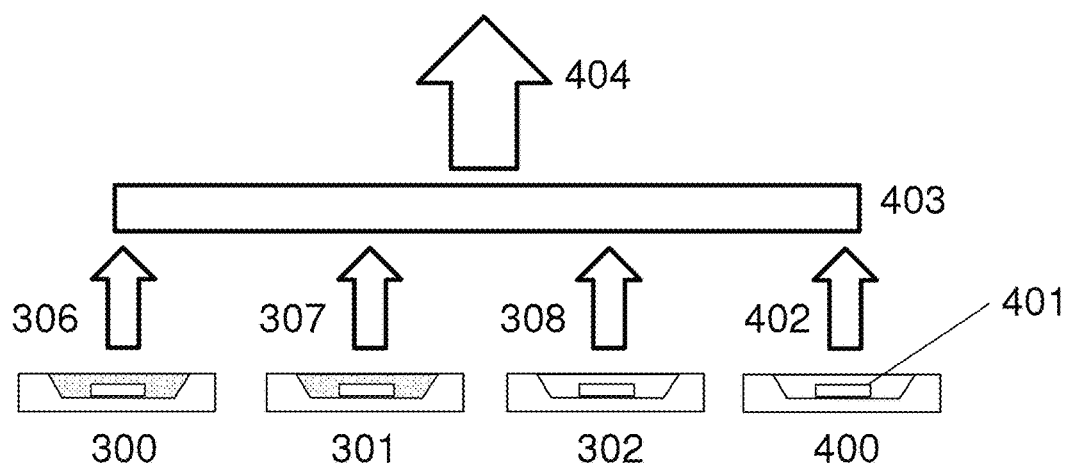
FIG. 4a shows a schematic of a second example light emitting module of the present invention.

In another embodiment of the present invention, the light emitting module further includes a fourth light emitting package. A schematic depicting an example light emitting module of the second aspect of the present invention is shown in FIG. 4a. The light emission, 402, generated from the fourth light emitting package 400, is predominantly arising from the fourth semiconductor light emitting device, 401. The emission, 402, resides within a chromaticity region bounded by 405 in FIG. 4b. The upper boundary of the region is defined by the isotherm bounded at the correlated colour temperature 200,000K and a second boundary extending from the Planckian locus at infinite CCT and projecting towards the boundary of the CIE chromaticity chart at 470 nm. The lower boundaries are defined along the 1931 CIE chromaticity chart.

In one example of this embodiment of the invention, the fourth light emitting package comprises a single source semiconductor emitter having a dominant wavelength in the range of blue to cyan with wavelengths ranging from 405 nm to 475 nm. The fourth light emitting package is designed to shift the CIExy coordinates of the emission of the first light emitting package towards the blue region and further improve the tolerance of acceptable first light emitting packages. This is important in order to maintain an improved colour tuning range between 3000K and 6500K, when the light emission of first light emitting package resides above the Planckian locus and within region 202. The light emission 306, 307, 308 and 402 is colour mixed using the colour mixing element 403 to give rise to the TEL 404. The colour mixing element 403 will employ similar techniques to those discussed in colour mixing element 309.

Figure 4B:
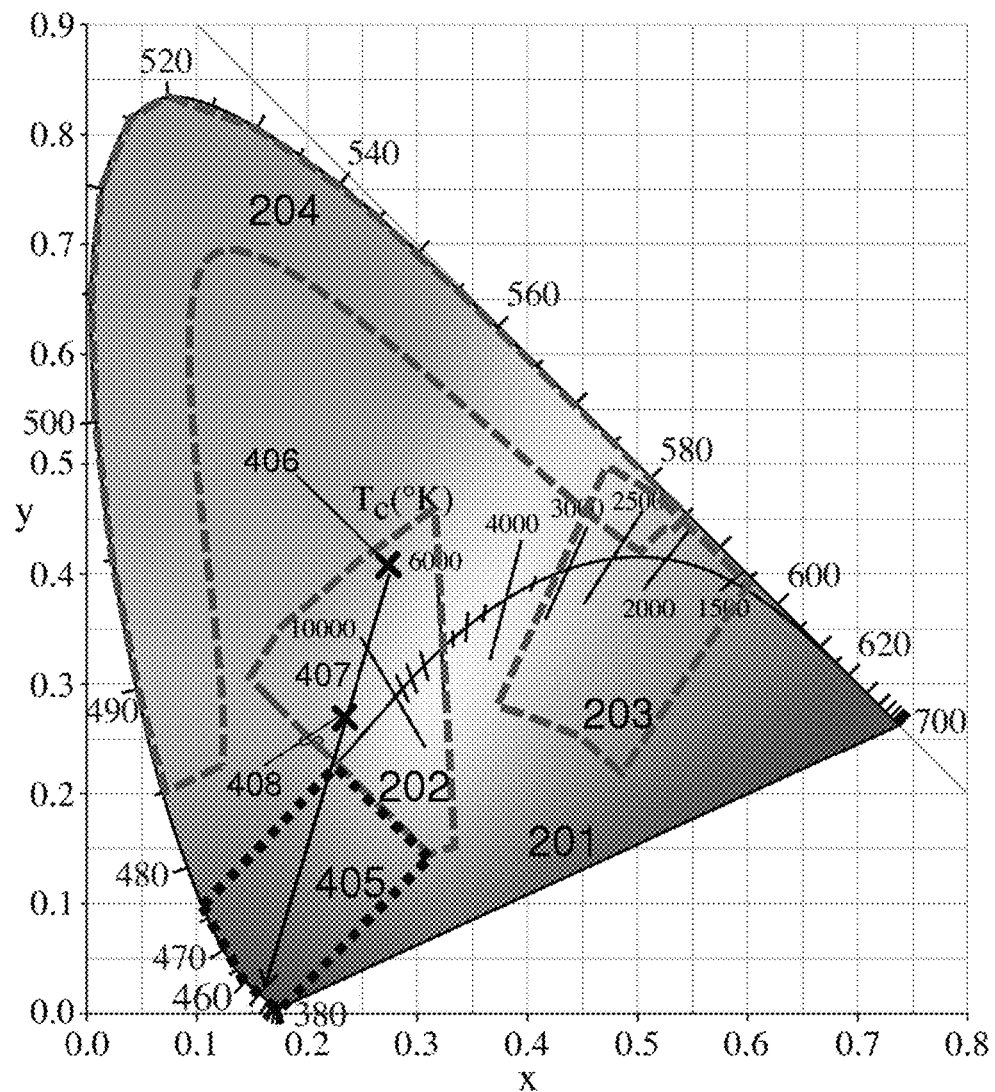
FIG. 4b shows the allowable chromaticity space for the first, second, third and fourth light emitting package of the present invention superimposed on a 1931 CIE Chromaticity diagram.

An example first light emitting package residing above the Planckian locus is depicted by point 406 in FIG. 4b. By introducing the fourth light emitting package, and in this case having light emission with a dominant wavelength of 450 nm, the CIExy coordinate for the first light emitting package is shifted down along the construction line 407. The shifted first light emitting package, now residing at CIExy coordinate 408, is able to form a much larger colour triangle when combined with the second and third light emitting packages. This enables a larger white colour CCT tuning range for the light emitting module of the present invention shifting the tuning range from the original narrow 3,000K-3,500K to an improved 3,000K-100,000K.

In one example of this embodiment of the present invention, a high colour quality, high efficiency device is proposed having a colour tuning range between 3,000K and 6,500K. The optical characteristics of the first, second, third and fourth light emitting package are highlighted in Table 4. The correlated colour temperature (CCT) for the third and fourth type light emitting package is not defined and hence the associated CRI is also not defined. The efficiency is measured at a pulsed current of 350 mA for all light emitting packages. By employing a pre-defined variation in intensity for each first, second, third and fourth light emitting package, the light emitting module of the present invention can achieve a tunable CCT between 3000K and 6000K and within a 4-step MacAdam ellipse of the Planckian locus while additionally achieving improvements in the CRI of TEL of the light emitting module.

TABLE 4

| Light emitting package | Description | CCT (K) | CRI | CIExy x | CIExy y | Efficiency (lm/W) |
|---|---|---|---|---|---|---|
| First type | Cool White LED | 6500K | 72 | 0.314 | 0.324 | 92.6 |
| Second type | Warm White LED | 2700K | 82 | 0.460 | 0.411 | 76.2 |
| Third type | Green LED | — | — | | | 69.3 |
| Fourth type | Blue LED | — | — | | | 20.8 |

Table 5 shows the relative intensity levels required from each channel and highlights the relative improvement (or gain) in CRI as compared to light emitting package of the first type. By adjusting the intensity of the first, second, third and fourth light emitting devices the CCT of the light emitting module of the present invention can be shifted along the Planckian locus and bounded only by the isotherm perpendicular to the CCT of the first light emitting device and the isotherm perpendicular to the CCT of the second light emitting device and can be optimised to reside within a narrow well defined 4 step MacAdam ellipse along the Planckian.

TABLE 5

| Tunable CCT (K) | Relative intensity of Light emitting packages (%) | | | | CIExy | | Relative CRI | CRI gain (%) |
|---|---|---|---|---|---|---|---|---|
| | First type | Second type | Third type | Fourth type | x | y | | |
| 3000 | 2.26 | 94.0 | 3.2 | 0.5 | 0.437 | 0.404 | 87 | 20.8 |
| 4000 | 12.0 | 75.0 | 10.3 | 2.6 | 0.381 | 0.377 | 93 | 29.2 |
| 6000 | 20.3 | 62.6 | 12.6 | 4.5 | 0.322 | 0.333 | 90 | 25.0 |

In the present example there exist at least four light emitting devices having only four possible different light emission spectra, namely those of the first, second, third and fourth light emitting device type. However, this provides an increased level of flexibility when compared with the first embodiment of the present invention having only three packages, and a single CIE chromaticity point along the Planckian may be achieved by multiple design combinations of the intensities of the first to fourth light emitting packages. The TEL characteristics are a function of light intensity of the first to fourth light emitting package. By modifying the pre-selected intensities of the four different light emitting packages the CCT, CRI and efficiency of the TEL of the light emitting module of the present invention can all be modified independently. Table 5 highlights an example light emitting module comprising high CRI and CCT residing on the Planckian locus and within a 4 step MacAdam ellipse.

Figure 4C:
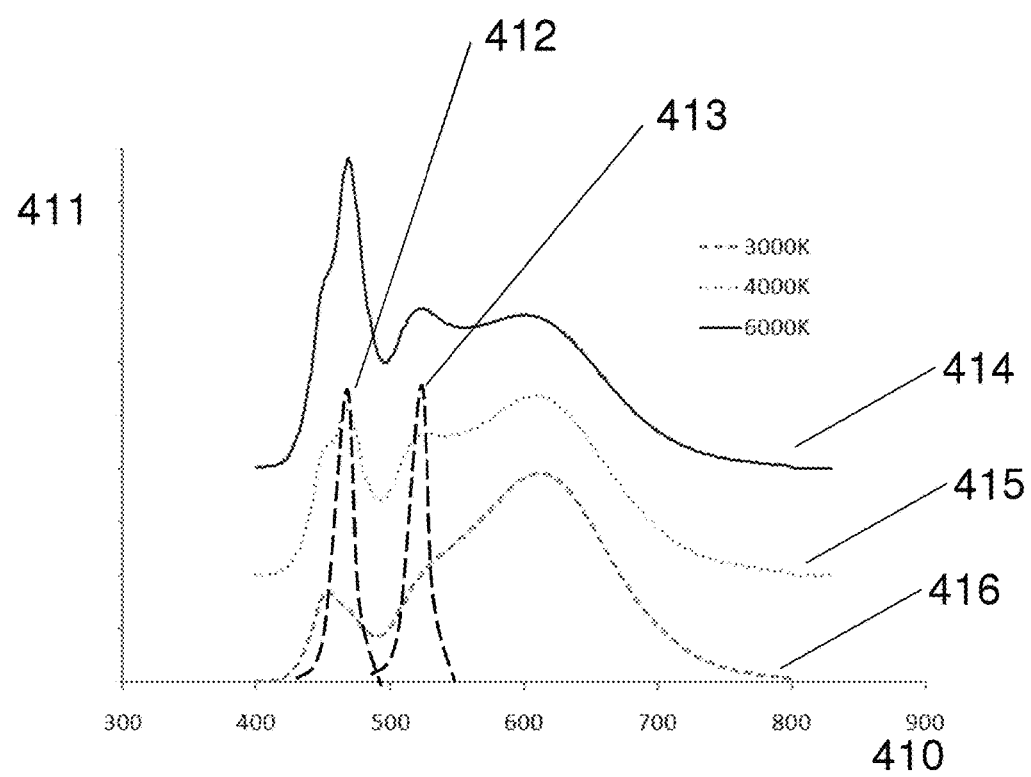
FIG. 4c shows a graph of power spectral density against wavelength of an example of a tunable light emitting module of the present invention.

The TEL of the present module is shown in FIG. 4c with power spectral density in arbitrary units, 411, is plotted against wavelength in nanometers, 410. The individual spectral peaks of the third, denoted by 413, and fourth light emitting packages, denoted by 412, are also highlighted. The light emitting module spectral content is demonstrated for three different CCT positions namely 3000K denoted by 414, at 4000K denoted by 415, and 6000K denoted by 416. The rich full spectral content of the colour mixed source provides the increased CRI qualities of the light emitting module while exhibiting minimal reduction in overall efficiency.

In a second aspect of the present invention, the high colour quality light source is provided with a memory. The memory may be integrated within the light emitting module or reside external to the light emitting module. One or more of the optical, electrical and thermal characteristics of the light emitting module are stored on the memory. The memory may alternatively include pre-determined calibration parameters defining the current drive conditions for the first to fourth light emitting packages. These parameters provide the correct current drive condition for each light emitting package within the light emitting module in order to achieve desired CCT and CRI for the TEL without the need for active feedback.

In an example of this aspect, the memory stores the CIExy coordinates for the first, second, third and fourth light emitting packages. In use, the activation of the light emitting module is determined by use of parameters stored on the memory. Prior to activation, the light emitting module driver reads the parameters stored on the memory and defines the intensity or drive characteristics of each individual light emitting package and or packages and activates the light emitting module. This provides a method of pre-setting the CCT and CRI of the TEL without having active colour sensing feedback or in-situ application measurement of the TEL of the light emitting module.

During manufacture or calibration, the optical and electrical characteristics of the first, second, third and fourth light emitting packages may be interrogated. The parameters are subsequently stored on the memory of the light emitting module and may comprise first, second, third or fourth CIExy coordinates, relative light intensity, relative light intensity against drive current, and relative light intensity against changes with ambient temperature.

In another embodiment of the second aspect of the present invention a light emitting module driver (LEMD) capable of activating the light emitting module is proposed. The LEMD of the present invention interrogates the memory to determine the pre-defined activation characteristics of each individual light emitting package of the first, second, third and fourth type as well as the desired operating CCT of the light emitting module. Subsequently the LEMD activates the individual first to fourth light emitting packages or packages to generate the desired CCT and CRI from the light emitting module.

The LEMD may comprise part of the control system of the light emitting module and provides a method of managing the activation properties of at least one light emitting package of the first, second, third or fourth type in the light emitting module. The control system in conjunction with the LEMD is designed to monitor, control and activate the light emitting module in order to maintain a pre-defined colour chromaticity for the colour mixed TEL. The active control may be continuous or at pre-defined intervals and allows the light emitting module to deliver accurate light output, CCT and CRI over varying operating temperature ranges and with operating lifetime.

In a third aspect of the present invention, the high colour quality light source is provided with a control system. The control system provides a method of managing the activation properties of at least one light emitting package of the first, second, third or fourth type in the light emitting module. The control system is designed to achieve a pre-defined colour chromaticity for the colour mixed TEL of the light emitting module. The control system may contain one or more of the following components, microcontroller, light emitting package drivers, memory, and multiple input and output channels. The control system is employed to provide the semiconductor LEDs with the desired current or voltage drive intensity to enable a pre-defined colour chromaticity from the LED module to be achieved.

Activation properties of the devices may comprise, but are not limited to, variations in current, voltage, light intensity, modulated signal, pulsed signal, pulse shape, pulse width and duty cycle and frequency.

The control system may further include an interface for connecting the control system to external sources and receiving information from the external sources. The control system may further incorporate one or more sensors connected to the control system to provide active feedback. The sensor may comprise a light intensity sensor, colour sensor or a temperature sensor.

The colour sensor may provide information on at least a portion of one or more of the light emitting packages in the light emitting module. The information may comprise of the light intensity, colour quality (or CRI) and colour chromaticity point of the TEL. The optical colour sensor may also analyse a component of the spectral content of the TEL using an array of photodiodes coupled to colour filters or gratings, CCD array, photodetector, bandpass filters or a spectrometer.

Figure 5A:
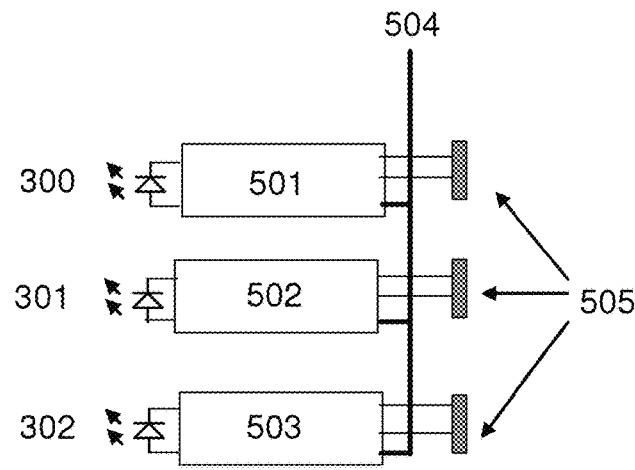
FIG. 5a shows a schematic of control system of the present invention.
Figure 5B:
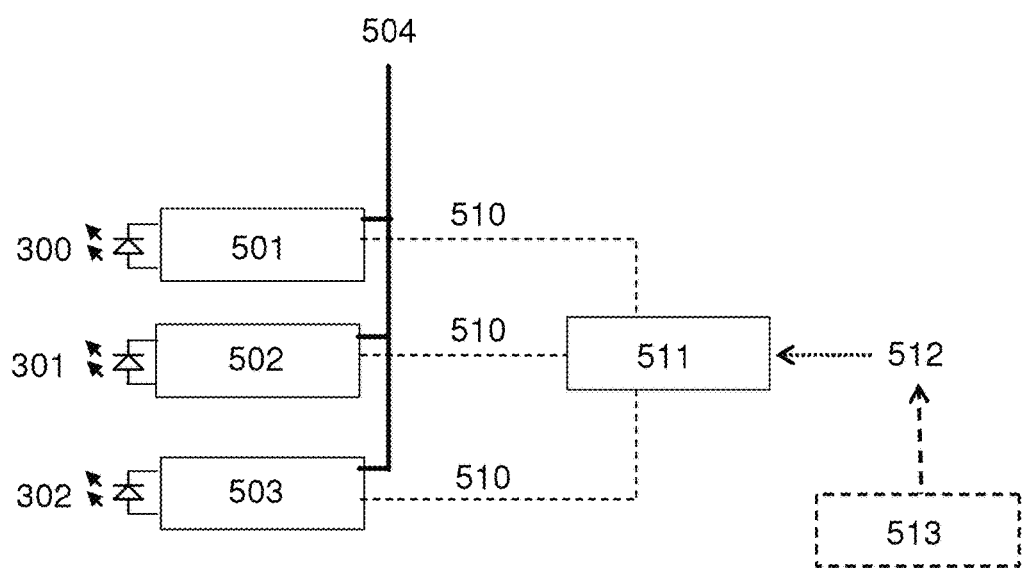
FIG. 5b shows a schematic of control system of the present invention further comprising a microprocessor.

An example of a simple control system is shown in FIG. 5a. The control system may comprise of an array of LED drivers for each of the first light emitting package 300, the second light emitting package 301 and the third light emitting package 302, each having individual components that may be modified (by means of tuning or trimming a characteristic such as resistance or capacitance), 505, to enable each driver to generate a different power output. One example method of pre-setting the colour chromaticity of the LED module is by use of active laser resistor trimming while monitoring of the light output characteristics of the LED module. A trimming resistor is connected to the feedback circuit of each first, 501, second, 502 and third 503 LED drivers, allowing individual control of the intensity of each light emitting package within the light emitting module.

In another preferred example of pre-setting the colour chromaticity, a microcontroller, 511, is employed (as shown in FIG. 6b) to control the dimming input, 510, of the LED drivers of each first to third light emitting package. Instead of active laser trimming of the resistor the microcontroller is programmed to include the exact dimming control signal to achieve the correct LED power intensity. An interface, 512, for factory pre-setting may also be included. In an alternative aspect of the example, the interface may communicate with the memory, 513, that contains the factory pre-set light emitting module parameters.

Figure 5C:
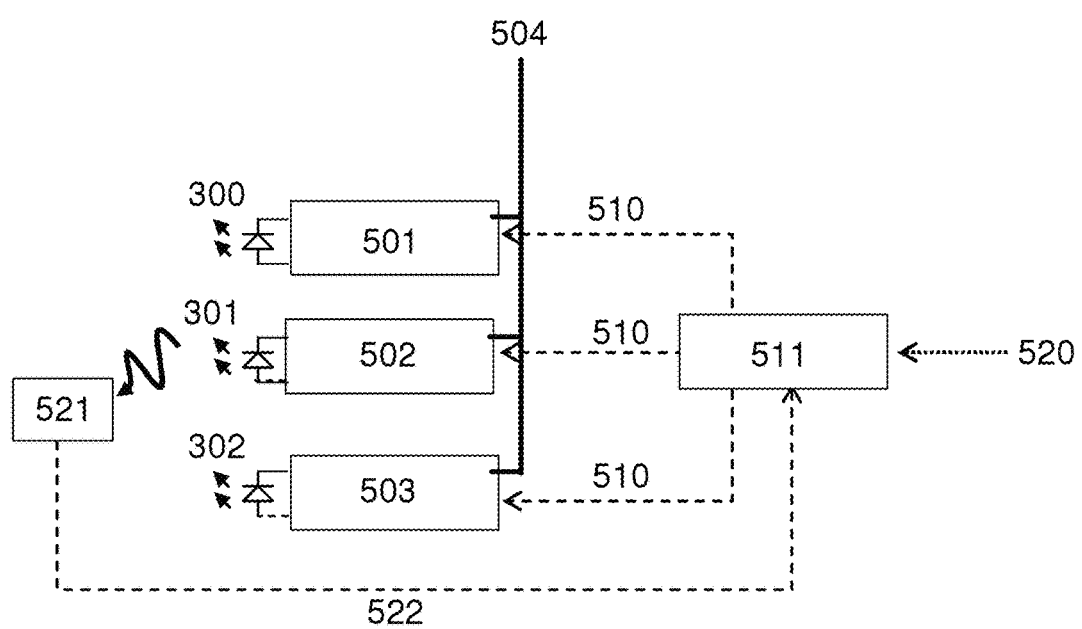
FIG. 5c shows a schematic of an example control system of the present invention further comprising a microprocessor and feedback.

In another embodiment of the controlled LED module system, the control system may also include a feedback loop. The feedback signal is achieved by use of an optical colour sensor as shown in FIG. 5c. A percentage of the total emitted light is allowed to incident the colour sensor, 521. The signal is fed back, 522, into the controller, 511. This data is processed with pre-calibrated algorithms embedded in the controller or the memory allowing the LED module to be adjusted for any deviations or drifts in colour chromaticity. The dimming lines of the LED drivers, 510 are accordingly adjusted by the controller. An interface, 520, is also provided for factory calibration algorithm downloads.

Figure 5D:
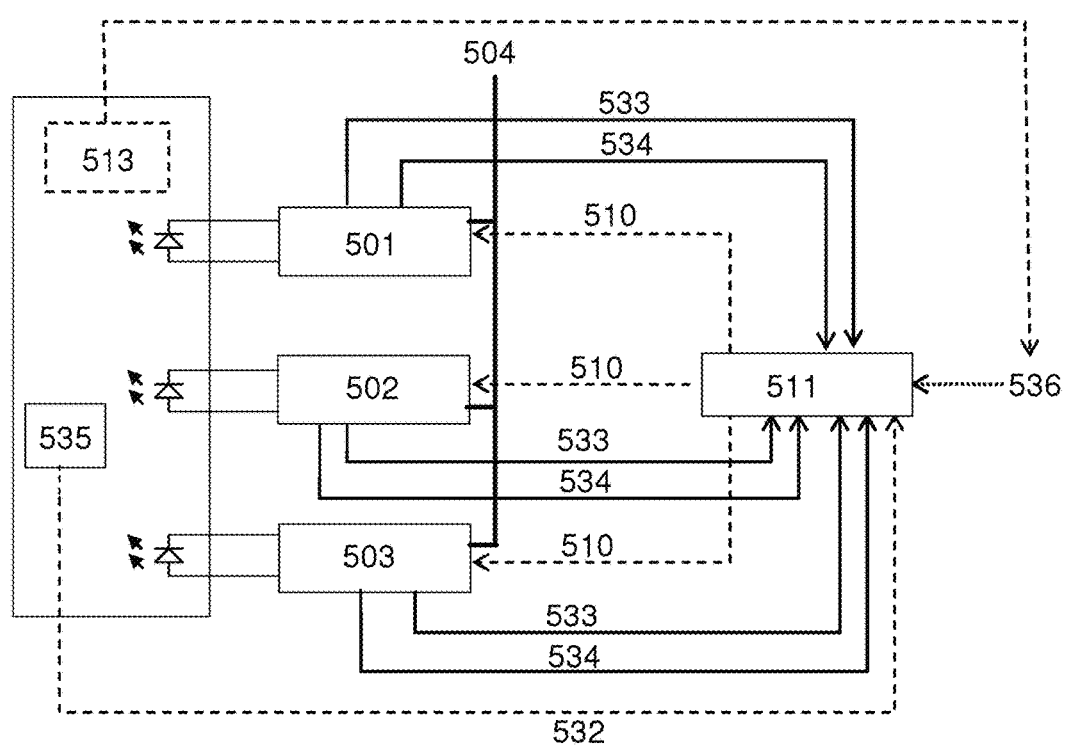
FIG. 5d shows a schematic of a second example control system of the present invention further comprising a microprocessor and feedback; and, FIG. 6 shows a schematic of a preferred method of manufacture.

In other embodiments of this aspect of the invention, the feedback signal is indirectly determined from secondary sensors. This is achieved by use of a temperature, voltage and current sensor as shown in FIG. 5d. These sensors monitor the individual light emitting packages for changes in operating temperature, 535, voltage, 533, and current, 534, across the lifetime and compare with the parameter database stored on the controller or the external memory, 513.

The temperature sensor may be externally attached to the electrical board housing the light emitting module. The temperature sensor may be in physical contact with the light emitting module but may also be indirectly linked through a thermal interface linking the light emitting module and the temperature sensor, whereby a direct correlation between the junction temperature of the LEDs within the light emitting module and the temperature sensor can be assumed. This feature of the present invention can only be achieved due to the use of identical LED die of the same semiconductor material system, namely Gallium Nitride in the present example. During operation, the optical, thermal and electrical characteristics are continually monitored in the microcontroller and any drifts are automatically determined for each first to fourth light emitting package. The drifts are determined by comparison to reference databases stored in the memory, 513, or the microcontroller, 511. The electrical current for individual first to fourth light emitting package is adjusted using dimming, 510, to indirectly correct the colour chromaticity of the total emitted light. The interface, 536, is also provided for factory calibration algorithms and colour controls.

Figure 6:
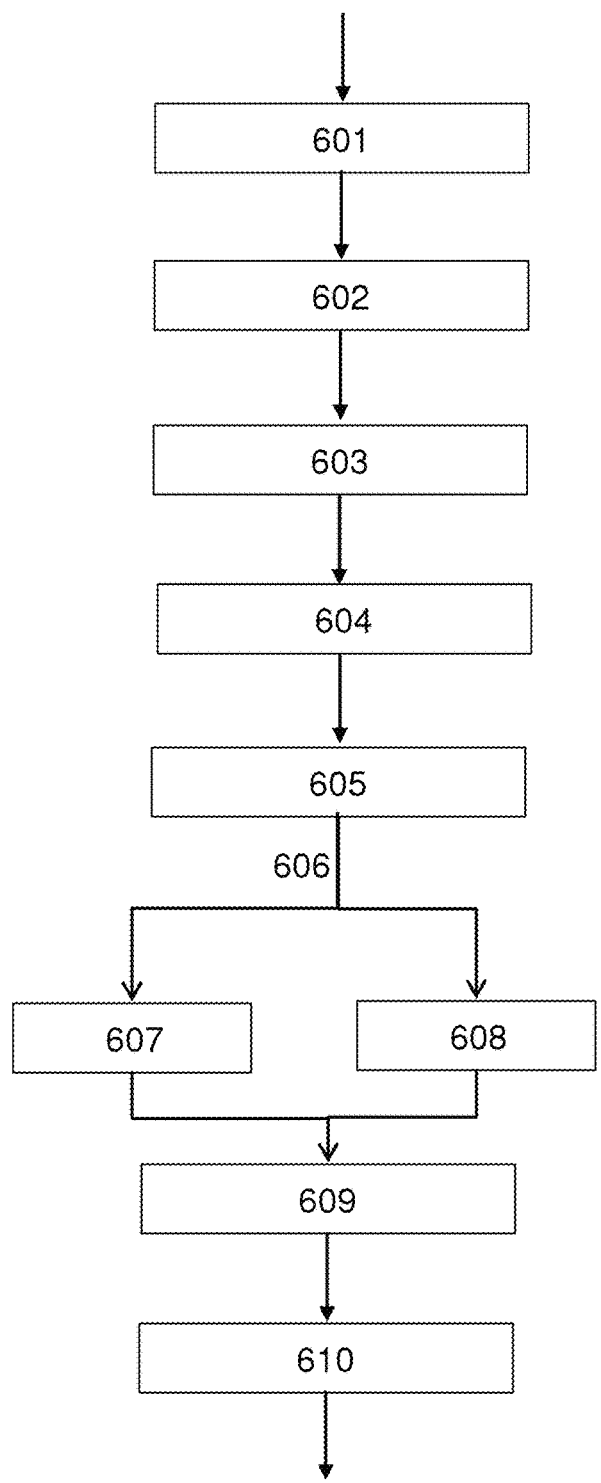

In a fourth aspect of the present invention a method of manufacture of the present light emitting module and control system is proposed, as depicted in the schematic diagram of FIG. 6.

The first light emitting package is attached to a submount as depicted in 601. Subsequently the second, 602, and third light emitting package, 603, is additionally attached to the same submount. The sub-mount may incorporate thermal dissipation elements for efficient heat management of the LED devices within the light emitting module. The submount further comprises electrical tracking to provide means of activating the light emitting packages.

A colour mixing element, 605, is attached proximal to the submount and the light emitting module. This is designed to efficiently homogenise the TEL to achieve a uniform colour against emission angle. This may comprise a diffuse reflector cup surrounding all the light emitting packages. The colour mixing element may also incorporate diffuse transmissive optics in the forward propagating path of the TEL.

The module is activated in order to characterise and derive calibration parameters, 606. Light emitting packages of the same type namely first, second, third or fourth are activated and the light intensity, emission spectrum and CIExy coordinates are registered.

If the light emitting module is to be pre-set and comprise of a fixed CCT a memory module is integrated incorporating the calibration characteristics of the unique light emitted and the desired CCT operating point of the module, 607. Alternatively, if a tunable light emitting module is to be defined a memory module is integrated into the light emitting module having only the calibration characteristics of the individual light emitting packages, 608. This constitutes a complete light emitting module.

The control system, drive electronics and sensors are subsequently assembled and electrically attached to the light emitting module 609. Any preset parameters are downloaded into the control unit via the interface, 610. The LED module is subsequently activated and the light output is monitored according to the control system protocol in order to deliver the desired CCT or CIExy coordinate, CRI and light intensity.

The invention claimed is:

1. A light emitting module comprising a first light emitting device (LED) package, a second LED package, a third LED package, and a fourth LED package, the total light emitted by the module comprising light emitted by the first, second and third light emitting packages, wherein:
   the first LED package comprises a first semiconductor LED and a first wavelength converting element, wherein when activated the first semiconductor generates light comprising a first dominant wavelength $\lambda_1$;
   the second LED package comprises a second semiconductor LED and a second wavelength converting element, wherein when activated the second semiconductor generates light comprising a second dominant wavelength $\lambda_2$; and,
   the third LED package comprises a third semiconductor LED which, when activated, generates light comprising a third dominant wavelength $\lambda_3$,
   the fourth LED package comprises a fourth semiconductor LED which, when activated, generates light comprising a fourth dominant wavelength $\lambda_4$;
   wherein:
   the first, the second and the third semiconductor LED comprise the same semiconductor material system;
   at least a portion of the light generated by the first semiconductor LED is incident on the first wavelength converting element and is re-emitted with a first converted optical spectrum comprising a first dominant converted wavelength $\lambda_{C1}$ such that $\lambda_1 < \lambda_{C1}$;
   at least a portion of the light generated by the second semiconductor LED is incident on the second wavelength converting element and is re-emitted with a second converted optical spectrum comprising a second dominant converted wavelength $\lambda_{C2}$ such that $\lambda_2 < \lambda_{C2}$, wherein the second converted optical spectrum is different than the first converted optical spectrum and $\lambda_{C1} \leq \lambda_{C2}$;
   the color chromaticity of light emitted by the first light emitting package resides in a 1960 CIE Uniform Colour Space bounded by a lower isotherm at a correlated color temperature of $T_1$ K and an upper isotherm at a correlated color temperature of 200,000 K, wherein an isotherm is defined as the line perpendicular to the Planckian locus, said light having a maximum color chromaticity shift of $\Delta_{uv} \leq \pm 0.10$ from the Planckian locus;
   the color chromaticity of light emitted by the second light emitting package resides in a 1960 CIE Uniform Colour Space bounded by an upper isotherm at a correlated color temperature of $T_2$ K and a lower isotherm bounded at the correlated color temperature of 1,000 K, said light having a maximum color chromaticity shift $\Delta_{uv} \leq \pm 0.10$ from the Planckian locus, wherein the correlated color temperature point of the intersection of the isotherm $T_1$ K with the Planckian is greater than or equal to $T_2$ K;
   the third dominant wavelength $\lambda_3$ of light emitted by the third light emitting package satisfies the criteria $\lambda_1, \lambda_2 < \lambda_3 < \lambda_{C1}, \lambda_{C2}$ and 485 nm $\leq \lambda_3 \leq$ 595 nm; and
   the fourth dominant wavelength $\lambda_4$ of light emitted by the fourth light emitting package is in the wavelength range 405 nm $\leq \lambda_4 \leq$ 475 nm.

2. A light emitting module according to claim 1, wherein correlated color temperature $T_1$ K=5,700 K and correlated color temperature $T_2$ K=3250K.

3. A light emitting module according to claim 1, wherein the total light emitted by the module is pre-defined at a correlated color temperature of 4000K and within a 4-step MacAdam ellipse and wherein a color rendering index (CRI) of the light is greater than or equal to 92.

4. A light emitting module according to claim 1, wherein the light emitted by the first LED package resides at a first pre-selected correlated color temperature with a color chromaticity tolerance greater than within a four step MacAdam ellipse;
   the light emitted by the second LED package resides at a second pre-selected correlated color temperature with a color chromaticity tolerance greater than within a four step MacAdam ellipse;
   the total light emitted by the module resides within a triangle bounded by the color chromaticity of the first, second and third LED packages and having a pre-defined correlated color temperature within a four step MacAdam ellipse tolerance; and,
   the light emitting module has an efficiency parameter and a color rendering index (CRI) parameter that is greater than or equal to the lower of said parameters for the first and second LED packages.

5. A light emitting module according to claim 1, wherein:
   the total light emitted by the module is tunable within a correlated color temperature range of 3,000 K to 6,500 K and is defined within a 4 step MacAdam ellipse; and,
   a color rendering index (CRI) for the light emitting module within the correlated color temperature range of 3,500 K to 6,000 K is greater than or equal to 90.

6. A light emitting unit comprising:
   a light emitting module according to claim 1; and,
   a memory module affixed proximal to the light emitting module, wherein pre-determined calibration parameters for the light emitting module are registered on the memory module.

7. A light emitting unit according to claim 6, wherein the memory module calibration parameters include one or more selected from a group which includes: first CIE xy coordinates, second CIE xy coordinates, third CIE xy coordinates, fourth CIE xy coordinates, relative light intensity against electrical current, and relative light intensity against ambient temperature.

8. A light emitting system comprising:
a light emitting module according to claim 1; and,
a control system for managing activation properties of at least one of the first, second, third and fourth LED packages in the light emitting module when activated, the control system being adapted to manage the activation properties to achieve a predefined color chromaticity and CRI for the total light emitted by the light emitting module.

9. A light emitting system according to claim 8, wherein the control system is further adapted to monitor electrical and thermal properties of the light emitting packages in the module and to provide feedback for modifying activation properties of the light emitting packages in order to achieve the predefined color chromaticity and CRI for the total light emitted by the light emitting module.

10. A light emitting system according to claim 8, further comprising a light sensor oriented to measure the color chromaticity properties of at least part of the total light emitted by the light emitting module, the control system being coupled to the light sensor and adapted to provide feedback to modify activation properties of the light emitting packages to achieve the predefined color chromaticity and CRI for the total light emitted by the light emitting module.

11. A light emitting system according to claim 8, wherein the control system further includes an interface for connection to external sources and for receiving information from the external sources.

12. A method of manufacturing a light emitting unit, the method comprising the steps of:
assembling a light emitting module by providing first, second, third, and fourth light emitting device (LED) packages and attaching them to a sub-mount;
affixing a color mixing element proximal to the submount such that it is at least partially in a propagation path of the total light emitted by the light emitting module;
affixing a memory module proximal to the light emitting module;
activating the light emitting module and determining calibration parameters for the module; and,
registering the calibration parameters on the memory module;
wherein:
the first LED package comprises a first semiconductor LED and a first wavelength converting element, wherein the first semiconductor when activated generates light comprising a first dominant wavelength $\lambda_1$, wherein at least a portion of the light generated by the first semiconductor LED is incident on the first wavelength converting element and is re-emitted with a first converted optical spectrum comprising a first dominant converted wavelength $\lambda_{C1}$ such that $\lambda_1 < \lambda_{C1}$, wherein the color chromaticity of light emitted by the first light emitting package resides in a 1960 CIE Uniform Colour Space bounded by a lower isotherm at a correlated color temperature of $T_1$ K and an upper isotherm at a correlated color temperature of 200,000 K, wherein an isotherm is defined as the line perpendicular to the Planckian locus, said light having a maximum color chromaticity shift of $\Delta_{uv} \leq \pm 0.10$ from the Planckian locus;
the second LED package comprises a second semiconductor LED and a second wavelength converting element, wherein when activated the second semiconductor generates light comprising a second dominant wavelength $\lambda_2$, wherein at least a portion of the light generated by the second semiconductor LED is incident on the second wavelength converting element and is re-emitted with a second converted optical spectrum comprising a second dominant converted wavelength $\lambda_{C2}$ such that $\lambda_2 < \lambda_{C2}$, wherein the second converted optical spectrum is different than the first converted optical spectrum and $\lambda_{C1} \leq \lambda_{C2}$, and wherein the color chromaticity of light emitted by the second light emitting package resides in a 1960 CIE Uniform Colour Space bounded by an upper isotherm at a correlated color temperature of $T_2$ K and a lower isotherm bounded at the correlated color temperature of 1,000 K, said light having a maximum color chromaticity shift $\Delta_{uv} \leq \pm 0.10$ from the Planckian locus, wherein the correlated color temperature point of the intersection of the isotherm $T_1$ K with the Planckian is greater than or equal to $T_2$ K;
the third LED package comprises a third semiconductor LED which, when activated, generates light comprising a third dominant wavelength $\lambda_3$, which satisfies the criteria $\lambda_1, \lambda_2 < \lambda_3 < \lambda_{C1}, \lambda_{C2}$ and 485 nm $\leq \lambda_3 \leq$ 595 nm; wherein the first, the second, and the third semiconductor LED comprise the same semiconductor material system; and
the fourth LED package comprises a fourth semiconductor LED which, when activated, generates light comprising a fourth dominant wavelength $\lambda_4$ in the wavelength range 405 nm $\leq \lambda_4 \leq$ 475 nm.

13. A method according to claim 12, the method further comprising the steps of:
assembling a control system;
presetting parameters in the control system; and,
interfacing the control system to the light emitting module and memory module,
whereby the control system is adapted to interrogate the memory module and to employ parameters residing on the memory for managing the activation properties of at least one of the first, second, third, and fourth LED packages in the light emitting module to achieve a predefined color chromaticity and CRI for the total light emitted by the light emitting module.

14. A light emitting system comprising:
a light emitting module including a first light emitting device (LED) package, a second LED package, and a third LED package, the total light emitted by the module including light emitted by the first, second and third light emitting packages, wherein:
the first LED package comprising a first semiconductor LED and a first wavelength converting element, wherein the first semiconductor LED, when activated, generates light comprising a first dominant wavelength $\lambda_1$, and wherein at least a portion of the light generated by the first semiconductor LED is incident on the first wavelength converting element and is re-emitted with a first converted optical spectrum comprising a first dominant converted wavelength $\Delta_{C1}$ such that $\lambda_1 < \lambda_{C1}$, wherein the color chromaticity of light emitted by the first light emitting package resides in a 1960 CIE Uniform Colour Space bounded by a lower isotherm at a correlated color temperature of $T_1$ K and an upper isotherm at a correlated color temperature of 200,000 K, wherein an isotherm is defined as the line perpendicular to the Planckian locus, said light (306,334) having a maximum color chromaticity shift of $\Delta_{uv} \leq \pm 0.10$ from the Planckian locus;

the second LED package comprises a second semiconductor LED and a second wavelength converting element, wherein the second semiconductor LED, when activated, generates light comprising a second dominant wavelength $\lambda_2$ and wherein at least a portion of the light generated by the second semiconductor LED is incident on the second wavelength converting element and is re-emitted with a second converted optical spectrum comprising a second dominant converted wavelength $\lambda_{C2}$ such that $\lambda_2 < \lambda_{C2}$, wherein the second converted optical spectrum is different than the first converted optical spectrum and $\lambda_{C1} \leq \lambda_{C2}$, and wherein the color chromaticity of light emitted by the second light emitting package resides in a 1960 CIE Uniform Colour Space bounded by an upper isotherm at a correlated color temperature of $T_2$ K and a lower isotherm bounded at the correlated color temperature of 1,000 K, said light having a maximum color chromaticity shift $\Delta_{uv} \leq \pm 0.10$ from the Planckian locus, wherein the correlated color temperature point of the intersection of the isotherm $T_1$ K with the Planckian is greater than or equal to $T_2$ K; and, the third LED package comprises a third semiconductor LED which, when activated, generates light comprising a third dominant wavelength $\lambda_3$ which satisfies the criteria $\lambda_1, \lambda_2 < \lambda_3 < \lambda_{C1}, \lambda_{C2}$ and 485 nm$\leq \lambda_3 \leq$595 nm, wherein each of the first, the second and the third semiconductor LED comprise the same semiconductor material system, and a control system for managing activation properties of at least one of the first, second and third LED packages in the light emitting module when activated, the control system comprising an interface for connection to external sources and for receiving information from the external sources, wherein the control system is adapted to manage the activation properties to achieve a predefined color chromaticity and CRI for the total light emitted by the light emitting module.

15. A method of manufacturing a light emitting system, the method comprising the steps of:

assembling a light emitting module by providing first, second, and third light emitting device (LED) packages and attaching them to a sub-mount;

assembling a control system comprising an interface for connection to external sources and for receiving information from the external sources, wherein the control system is adapted to manage activation properties of at least one of the first, second, and third light emitting packages in the light emitting module to achieve a predefined color chromaticity and CRI for the total light emitted by the light emitting module; and interfacing the control system to the light emitting module, wherein:

the first LED package comprises a first semiconductor LED and a first wavelength converting element, wherein the first semiconductor LED, when activated, generates light comprising a first dominant wavelength $\lambda_1$ and wherein at least a portion of the light generated by the first semiconductor LED is incident on the first wavelength converting element and is re-emitted with a first converted optical spectrum comprising a first dominant converted wavelength $\lambda_{C1}$ such that $\lambda_1 < \lambda_{C1}$ wherein the color chromaticity of light emitted by the first light emitting package resides in a 1960 CIE Uniform Colour Space bounded by a lower isotherm at a correlated color temperature of $T_1$ K and an upper isotherm at a correlated color temperature of 200,000 K, wherein an isotherm is defined as the line perpendicular to the Planckian locus, said light (306,334) having a maximum color chromaticity shift of $\Delta_{uv} \leq \pm 0.10$ from the Planckian locus;

the second LED package comprises a second semiconductor LED and a second wavelength converting element, wherein the second semiconductor LED, when activated, generates light comprising a second dominant wavelength $\lambda_2$ and wherein at least a portion of the light generated by the second semiconductor LED is incident on the second wavelength converting element and is re-emitted with a second converted optical spectrum comprising a second dominant converted wavelength $\lambda_{C2}$ such that $\lambda_2 < \lambda_{C2}$, wherein the second converted optical spectrum is different than the first converted optical spectrum and $\lambda_{C1} \leq \lambda_{C2}$, and wherein the color chromaticity of light emitted by the second light emitting package resides in a 1960 CIE Uniform Colour Space bounded by an upper isotherm at a correlated color temperature of $T_2$ K and a lower isotherm bounded at the correlated color temperature of 1,000 K, said light having a maximum color chromaticity shift $\Delta_{uv} \leq \pm 0.10$ from the Planckian locus, wherein the correlated color temperature point of the intersection of the isotherm $T_1$ K with the Planckian is greater than or equal to $T_2$ K; and, the third LED package comprises a third semiconductor LED which, when activated, generates light comprising a third dominant wavelength $\lambda_3$ which satisfies the criteria $\lambda_1, \lambda_2 < \lambda_3 < \lambda_{C1}, \lambda_{C2}$ and 485 nm$\leq \lambda_3 \leq$595 nm, wherein each of the first, the second and the third semiconductor LED comprise the same semiconductor material system.

* * * * *